(12) United States Patent
You et al.

(10) Patent No.: US 10,438,854 B2
(45) Date of Patent: Oct. 8, 2019

(54) METHOD FOR MANUFACTURING CMOS STRUCTURE

(71) Applicant: Silergy Semiconductor Technology (Hangzhou) LTD, Hangzhou, ZheJiang Province (CN)

(72) Inventors: Budong You, Hangzhou (CN); Zheng Lyu, Hangzhou (CN); Xianguo Huang, Hangzhou (CN); Chuan Peng, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 2 days.

(21) Appl. No.: 15/995,330

(22) Filed: Jun. 1, 2018

(65) Prior Publication Data

US 2018/0277447 A1    Sep. 27, 2018

Related U.S. Application Data

(63) Continuation of application No. 14/823,058, filed on Aug. 11, 2015, now abandoned.

(30) Foreign Application Priority Data

Aug. 11, 2014 (CN) ............. 2014 1 0392572
Sep. 9, 2014 (CN) ............. 2014 1 0456374

(51) Int. Cl.
*H01L 21/82* (2006.01)
*H01L 21/265* (2006.01)
(Continued)

(52) U.S. Cl.
CPC ........... *H01L 21/823814* (2013.01); *H01L 21/26593* (2013.01); *H01L 21/8238* (2013.01);
(Continued)

(58) Field of Classification Search
CPC ..... H01L 21/823814; H01L 21/823842; H01L 21/26593; H01L 29/66803; H01L 21/8238
See application file for complete search history.

(56) References Cited

U.S. PATENT DOCUMENTS

| 4,997,782 A | 3/1991 | Bergonzoni |
| 6,803,285 B2 | 10/2004 | Mistry et al. |

(Continued)

FOREIGN PATENT DOCUMENTS

| CN | 1423837 A | 6/2003 |
| CN | 103026485 A | 4/2013 |
| CN | 103137694 A | 6/2013 |

*Primary Examiner* — Thanhha S Pham
(74) *Attorney, Agent, or Firm* — Michael C. Stephens, Jr.

(57) ABSTRACT

The present disclosure relates to a method for manufacturing a CMOS structure. A first gate stack is formed on a semiconductor substrate in a first region. A second gate stack is formed on the semiconductor substrate in a second region. A dopant of a first type is implanted with the first gate stack and the second gate stack as a hard mask to form a lightly-doped drain region of the first type. A dopant of a second type is implanted by using a first mask and with the second gate stack as a hard mask to form a lightly-doped drain region of the second type. The first mask blocks the first region and exposes the second region. When the lightly-doped drain region of the second type is formed, the dopant of the second type over dopes a predetermined region of the lightly-doped drain region of the first type.

10 Claims, 6 Drawing Sheets

(51) Int. Cl.
*H01L 29/66* (2006.01)
*H01L 21/8238* (2006.01)

(52) U.S. Cl.
CPC ........... *H01L 21/823842* (2013.01); *H01L 29/66803* (2013.01); *H01L 21/823828* (2013.01)

(56) References Cited

U.S. PATENT DOCUMENTS

| | | |
|---|---|---|
| 8,377,772 B2 | 2/2013 | Xiong et al. |
| 2008/0308878 A1 | 12/2008 | Bulucea |
| 2011/0221000 A1 | 9/2011 | Shima |
| 2013/0056833 A1* | 3/2013 | Takeoka .......... H01L 21/823842 257/369 |

* cited by examiner

METHOD FOR MANUFACTURING CMOS STRUCTURE

CLAIM OF PRIORITY

This application is a continuation of the following application, U.S. patent application Ser. No. 14/823,058, filed on Aug. 11, 2015, and which is hereby incorporated by reference as if it is set forth in full in this specification, and which also claims priority to Chinese Application No. 201410392572.9, filed Aug. 11, 2014 (not published), and claims priority to Chinese Application No. 201410456374.4, filed Sep. 9, 2014 (published as CN 104167391 A), both of which are hereby incorporated by reference.

BACKGROUND OF THE DISCLOSURE

Field of the Disclosure

The present disclosure relates to semiconductor technology, and more particularly, to a method for manufacturing a complementary metal oxide semiconductor (CMOS) structure.

Description of the Related Art

A CMOS structure includes metal-oxide-semiconductor field-effect transistors (MOSFETs) of two opposite types (i.e. N-type and P-type) on one semiconductor substrate. The CMOS structure is widely used in various logical circuits which operates at low power consumption. A control chip of a power converter has advantages of low power consumption, high integration level, and high speed, if being on the basis of a CMOS structure.

To complete a CMOS structure, a well region is typically formed in a semiconductor substrate for at least one type of MOSFET. Source/drain regions of the at least one type of MOSFET are then formed in the well region by ion implantation. The well region has a doping type opposite to that of the MOSFET to be formed therein, and functions as an actual semiconductor substrate of such a MOSFET. Lightly-doped drain (LDD region) regions may also be formed between the source/drain regions and a channel region for improving electric field distribution in the channel region and suppressing a short-channel effect.

In a conventional CMOS process, doping processes are usually independent of each other for different types of MOSFETs. When doped regions of one type of MOSFETs are formed, active regions of the other type of MOSFETs are blocked, or vice versa. Consequently, a large number of masks must be used in various doping steps in the conventional CMOS process, which increases manufacturing cost, and may cause low yield and poor reliability of the product due to possible mismatching of different masks.

Thus, it is desirable to further reduce manufacturing cost of a CMOS process and reduce reliability problem due to the process complexity.

BRIEF DESCRIPTION OF THE DISCLOSURE

In view of this, the present disclosure provides a method for manufacturing a CMOS structure in which less masks are used.

In an embodiment, there is provided a method for manufacturing a CMOS structure, comprising: forming a first gate stack on a semiconductor substrate in a first region; forming a second gate stack on the semiconductor substrate in a second region; implanting a dopant of a first type with the first gate stack and the second gate stack as a hard mask, to form a lightly-doped drain region of the first type; and implanting a dopant of a second type by using a first mask and with the second gate stack as a hard mask, to form a lightly-doped drain region of the second type, wherein the first mask blocks the first region and exposes the second region, wherein when the lightly-doped drain region of the second type is formed, the dopant of the second type over dopes a predetermined region of the lightly-doped drain region of the first type.

Preferably, each of the first gate stack and the second gate stack comprises a gate conductor and a gate dielectric, and the gate dielectric is disposed between the gate conductor and the semiconductor substrate.

Preferably, the gate conductor is made of polysilicon.

Preferably, after the steps of forming the first gate stack and forming the second gate stack, the method further comprises doping the gate conductor of at least one of the first gate stack and the second gate stack to adjust work function.

Preferably, before the step of forming the first gate stack, the method further comprises at least one of: forming a first well region of the second type by implanting a dopant of the second type in the first region of the semiconductor substrate; and forming a second well region of the first type by implanting the dopant of the first type in the second region of the semiconductor substrate.

Preferably, at least one of the first well region and the second well region has a doping concentration which is controlled in view of a threshold voltage.

Preferably, before the step of forming the first gate stack, the method further comprises forming shallow trench isolation in the semiconductor substrate for defining the first region for MOSFETs of the first type and the second region for MOSFETs of the second type.

Preferably, after the steps of forming the first gate stack and forming the second gate stack, and before the steps of forming the lightly-doped drain region of the first type and forming the lightly-doped drain region of the second type, the method further comprises forming gate spacers on side walls of the first gate stack and the second gate stack.

Preferably, after the steps of forming the lightly-doped drain region of the first type and forming the lightly-doped drain region of the second type, the method further comprises forming gate spacers on side walls of the first gate stack and the second gate stack.

Preferably, after the steps of forming the first gate stack and forming the second gate stack, and after the step of forming the lightly-doped drain region of the first type, and before the step of forming the lightly-doped drain region of the second type, the method further comprises forming gate spacers on side walls of the first gate stack and the second gate stack.

Preferably, the method further comprises implanting a dopant of the first type by using a second mask and with the first gate stack and the gate spacers as a hard mask, to form source/drain regions of the first type, wherein the second mask blocks the second region and exposes the first region; and implanting a dopant of the second type by using a third mask and with the second gate stack and the gate spacers as a hard mask, to form source/drain regions of the second type, wherein the third mask blocks the first region and exposes the second region.

Preferably, the method further comprises implanting a dopant of the second type by using the first mask and with the second gate stack and the gate spacers as a hard mask, to form the lightly-doped drain region of the second type and source/drain regions of the second type, wherein the first mask blocks the first region and exposes the second region, and implanting a dopant of the first type by using a second mask and with the first gate stack and the gate spacers as a hard mask, to form source/drain regions of the first type, wherein the second mask blocks the second region and exposes the first region.

Preferably, the method further comprises implanting a dopant of the second type by angled ion implantation through the gate spacers to form the lightly-doped drain region of the second type.

Preferably, after the steps of forming the source/drain regions of the first type and forming the source/drain regions of the second type, the method further comprises performing silicidation to form a metal silicide layer on the source/drain regions of the first type, on the source/drain regions of the second type, and on the gate stack.

Preferably, the gate conductor of the first gate stack contains a dopant of the first type, and the gate conductor of the second gate stack contains a dopant of the first type and a dopant of the second type.

In the present method, a predetermined region of the lightly-doped region of the first type is over doped and compensated to be a lightly-doped drain region of the second type. Only one mask is used for both the first-type MOSFETs and second-type MOSFETs when forming the lightly-doped regions, which reduces the number of the masks. Accordingly, the failure of the CMOS structure due to mismatching of different masks is avoided.

In a preferable embodiment, a doping concentration of the well region may be well controlled in view of a threshold voltage when at least one of the first well region and the second well region is formed, so that work function difference between the gate conductor and the channel region fulfills design requirements. Thus, an additional ion implantation for adjusting work function by doping the gate conductor is omitted.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1:
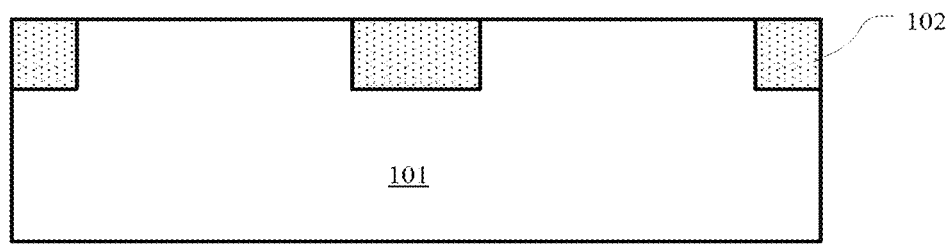
FIGS. 1 to 12 are cross-sectional views showing various stages of a method for manufacturing a CMOS structure according to an embodiment of the present disclosure.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in a doping region of the another region.

In the present application, the term "semiconductor structure" means generally the whole semiconductor structure formed at each step of the method for manufacturing the semiconductor device, including all of the layers and regions having been formed. The term "source/drain region" means at least one of a source region and a drain region of a MOSFET.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless the context clearly indicates otherwise, each part of the semiconductor device can be made of material(s) well known to one skilled person in the art. The semiconductor material includes for example group III-V semiconductor, such as GaAs, InP, GaN, and SiC, and group IV semiconductor, such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, Ni3Si, Pt, Ru, W, and their combinations. A gate dielectric may be made of SiO2 or any material having dielectric constant larger than that of SiO2. For example, the gate dielectric may be made of one selected from a group consisting of oxides, nitrides, oxynitrides, silicates, aluminates, and titanates. Moreover, the gate dielectric can be made of those developed in the future, besides the above known materials.

The disclosure can be embodied in various forms, some of which will be described below.

Referring to FIGS. 1 to 12, various stages of a method for manufacturing a CMOS structure according to an embodiment of the present disclosure will be described hereinbelow.

As shown in FIG. 1, shallow trench isolations (STIs) 102 are formed in a semiconductor substrate 101. The shallow trench isolations 102 are used for defining various active regions of the CMOS structure. In an example, the semiconductor substrate 101 is a single-crystal silicon substrate.

In a preferable embodiment, a photoresist layer is formed on a surface of the semiconductor substrate, and then patterned by lithography to be a photoresist mask which exposes those regions other than active regions (also being referred to as field regions). Portions of the semiconductor substrate 101 are removed by a conventional etching process which is performed from top to bottom through openings in the photoresist mask to form shallow trenches. The etching may be dry etching such as ion beam milling, plasma etching, reactive ion etching, laser ablation and the like, or wet etching using a selective solution of etchant. Then, the photoresist mask is removed by ashing or dissolution with a solvent.

An insulating layer is then formed on a surface of the semiconductor structure by a conventional deposition process. The insulating layer has a thickness at least large enough to fill up the shallow trenches. For example, the deposition process may be one selected from a group consisting of electron beam evaporation (EBM), chemical vapor deposition (CVD), atomic layer deposition (ALD), and sputtering. For example, a surface of the semiconductor structure may be planarized by chemical mechanical polishing so that portions of the insulating layer outside the shallow trenches are removed and the remaining portions of the insulating layer form shallow trench isolation (STI).

Figure 2:
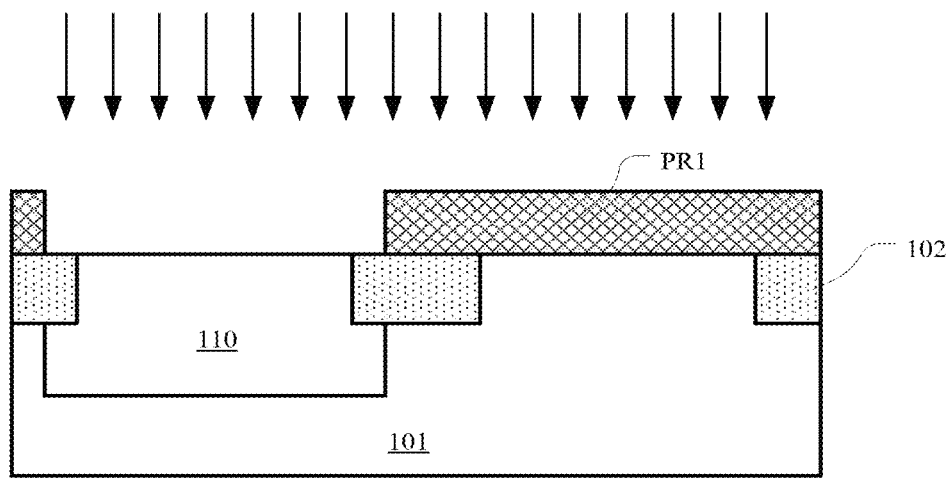

Next, a photoresist layer is formed on a surface of the semiconductor structure, and then patterned by lithography to be a photoresist mask PR1 which exposes an active region of a P-type MOSFET. A first ion implantation is performed by a conventional ion implantation and driving-in process to form an N-type well region 110 of a P-type MOSFET in the semiconductor substrate 101, as shown in FIG. 2. A dopant reaches the semiconductor substrate 101 through the openings in the photoresist mask PR1 in the ion implantation. Then, the photoresist mask is removed by ashing or dissolution with a solvent.

An N-type semiconductor layer or region may be formed by implanting an N-type dopant such as P or As in the semiconductor layer or region. By controlling implantation parameters, such as implantation energy and dosage, the dopant may reach a predetermined depth and may have a predetermined doping concentration.

Figure 3:
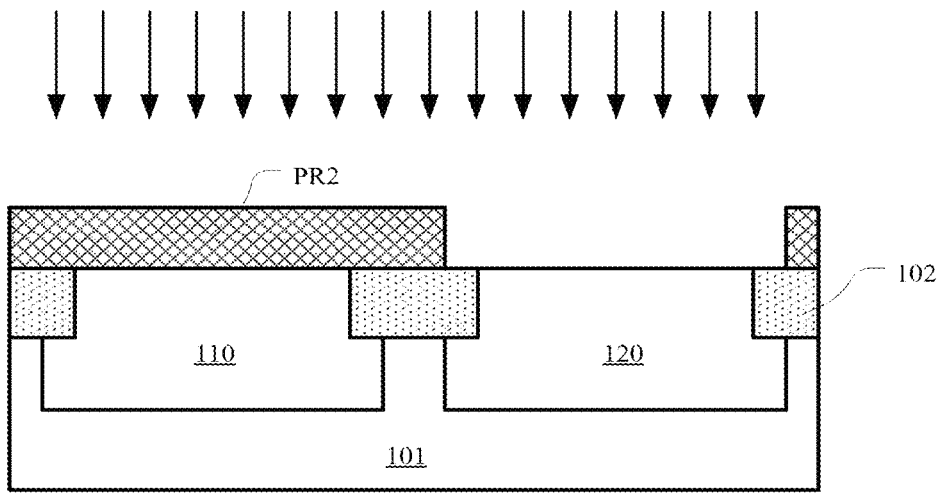

Next, a photoresist layer is formed on a surface of the semiconductor structure, and then patterned by lithography to be a photoresist mask PR2 which exposes an active region of an N-type MOSFET. A second ion implantation is performed by a conventional ion implantation and driving-in process to form a P-type well region 120 of an N-type MOSFET in the semiconductor substrate 101, as shown in FIG. 3. A dopant reaches the semiconductor substrate 101 through the openings in the photoresist mask PR2 in the ion implantation. Then, the photoresist mask is removed by ashing or dissolution with a solvent.

A P-type semiconductor layer or region may be formed by implanting a P-type dopant such as B in the semiconductor layer or region. By controlling implantation parameters, such as implantation energy and dosage, the dopant may reach a predetermined depth and may have a predetermined doping concentration.

It is well known that a threshold voltage of a MOSFET is mainly determined by work function difference between the gate conductor and the channel region. In a conventional CMOS process, a gate conductor of an N-type MOSFET is typically doped to adjust its work function, which further changes the threshold voltage. Doping the gate conductor must be performed in an additional ion implantation process.

In a preferable embodiment, a doping concentration of a P-type well region 120 may be well controlled in view of a threshold voltage when the P-type well region 120 is formed, so that work function difference between the gate conductor and the channel region fulfills design requirements. In an example, the P-type well region 120 has a doping concentration of about $2 \times 10^{17}/cm^3$, which is smaller than a typical doping concentration of about $7 \times 10^{17}/cm^3$ of the P-type well region in a conventional CMOS process. In this preferable embodiment, an additional ion implantation for doping the gate conductor and for adjusting work function can be omitted.

In the first ion implantation and the second ion implantation, the N-type well region 110 and the P-type well region 120 are defined respectively by the photoresist masks. The photoresist masks may be designed to have predetermined patterns so that the N-type well region 110 and the P-type well region 120 are separated from each other by the shallow trench isolation 102 at the surface of the semiconductor structure, and are separated from each other with a distance below the shallow trench isolation 102.

Figure 4:
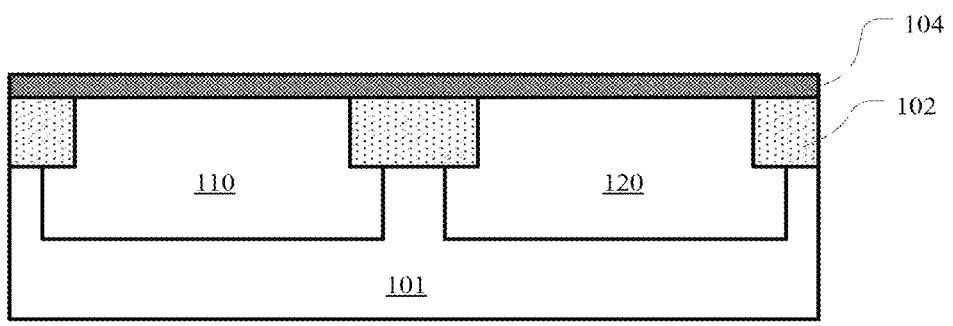

Next, a gate dielectric 104 is then formed on the surface of the semiconductor structure by the above conventional deposition process, as shown in FIG. 4. In an example, the gate dielectric 104 is a thermally-grown oxide layer such as silicon oxide, with a thickness of about 10-15 nanometers.

Figure 5:
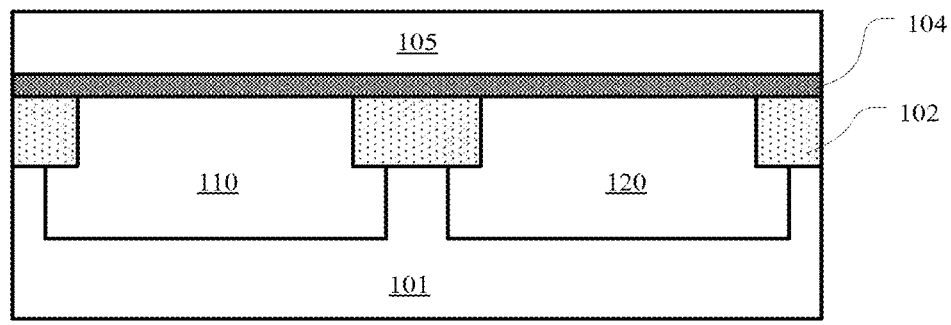
Figure 6:
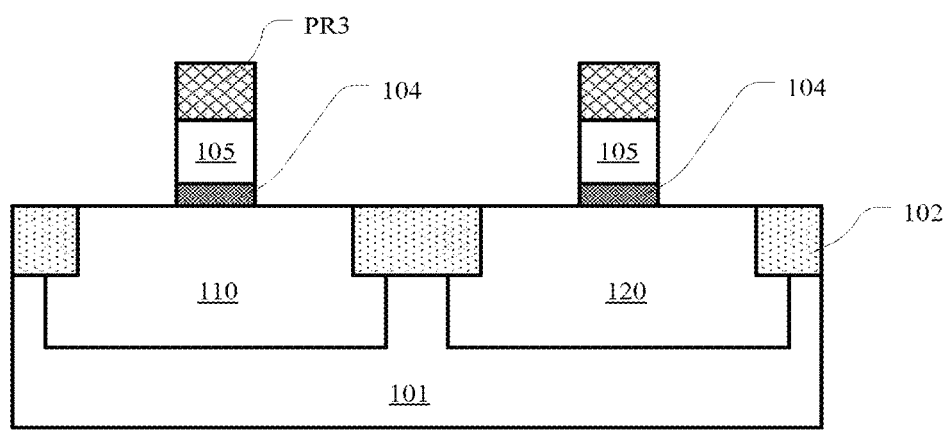

Next, a gate conductor 105 is formed on the gate dielectric 104 by the above conventional deposition process, as shown in FIG. 5. In an example, the gate conductor 105 is a polysilicon layer, with a thickness of about 200 nanometers. Next, a photoresist layer is formed on a surface of the semiconductor structure, and then patterned by lithography to be a photoresist mask PR3. Etching is performed through the photoresist mask PR3. The etching is performed from top to bottom through the openings in the photoresist mask to remove exposed portions of the gate conductor 105 and the gate dielectric 104, as shown in FIG. 6. Due to selectivity of the etchant, the etching stops at the surface of the N-type well region 110 and the P-type well region 120. In the etching, the pattern of the photoresist mask PR3 defines a shape of the gate stack. Then, the photoresist layer is removed by ashing or dissolution with a solvent.

Figure 7:
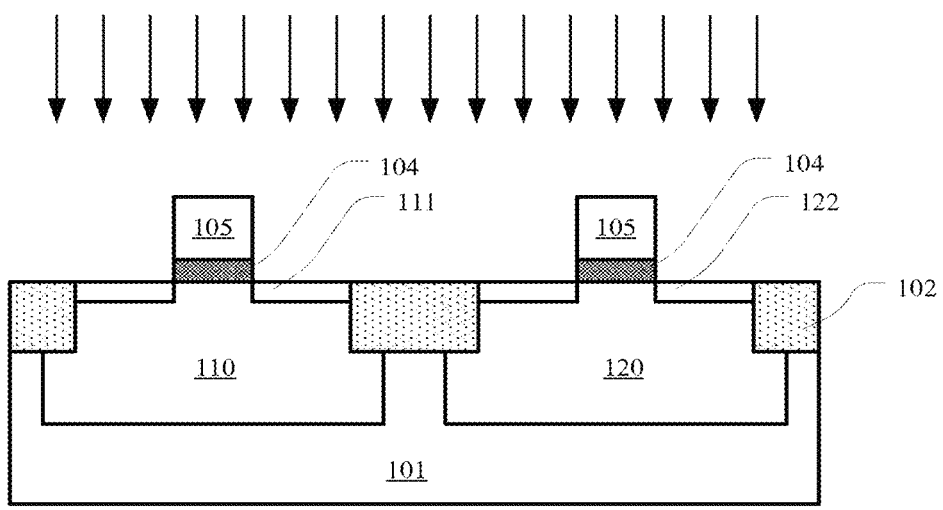

Next, a third ion implantation is performed with the gate conductor 105 and the shallow trench isolation 102 together as a hard mask, without using an additional photoresist mask, to form a LDD region 111 in the N-type well region 110 near the surface and a LDD region 122 in the P-type well region 120 near the surface. An N-type dopant is used in the ion implantation, as shown in FIG. 7. Thus, both the LDD region 111 and the LDD region 122 are N-type doping regions.

Moreover, the N-type dopant is also implanted into the gate conductor 105 of the P-type MOSFET and the N-type MOSFET in the ion implantation.

Figure 8:
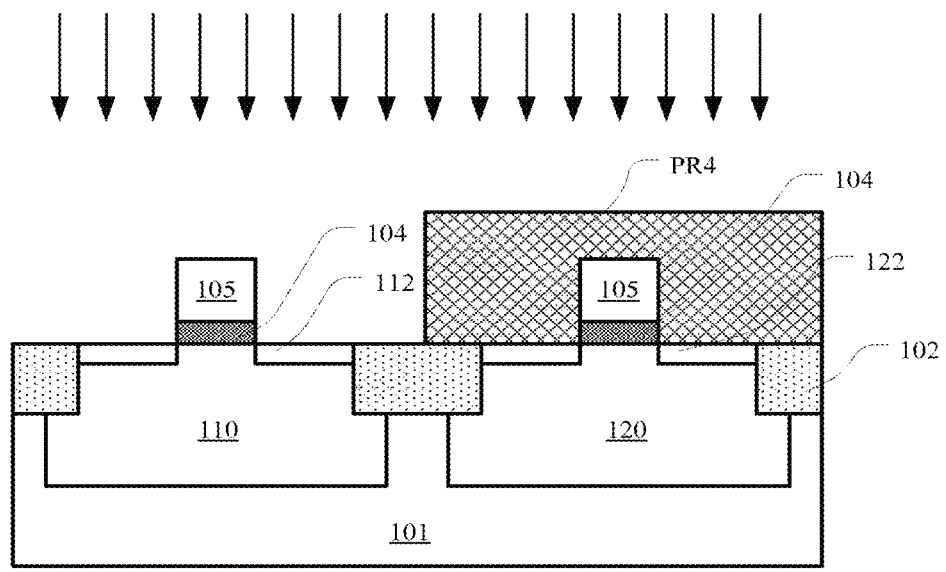

Next, a photoresist layer is formed on a surface of the semiconductor structure, and then patterned by lithography to be a photoresist mask PR4. The photoresist mask PR4 blocks the active region of the N-type MOSFET and exposes the active region of the P-type MOSFET. A fourth ion implantation is performed by using the photoresist PR4. A dopant reaches the N-type well region 110 through the openings in the photoresist mask PR4 in the implantation, as shown in FIG. 8. Then, the photoresist mask is removed by ashing or dissolution with a solvent.

A P-type dopant is used in the fourth ion implantation, which has a dosage larger than that of the N-type dopant used in the third ion implantation. Thus, the P-type dopant over dopes a region of the N-type LDD region 111 to be a P-type LDD region 112.

Moreover, the N-type dopant is also implanted into only the gate conductor 105 of the P-type MOSFET.

Only one photoresist mask is used for the P-type MOSFET and the N-type MOSFET in the third ion implantation and the fourth ion implantation when forming the above LDDs. Two opposite-types of LDD regions are formed by over doping even in a case that only one photoresist mask is used. Thus, the number of the photoresist masks is reduced. The failure of the CMOS structure due to mismatching of different masks is avoided.

Figure 9:
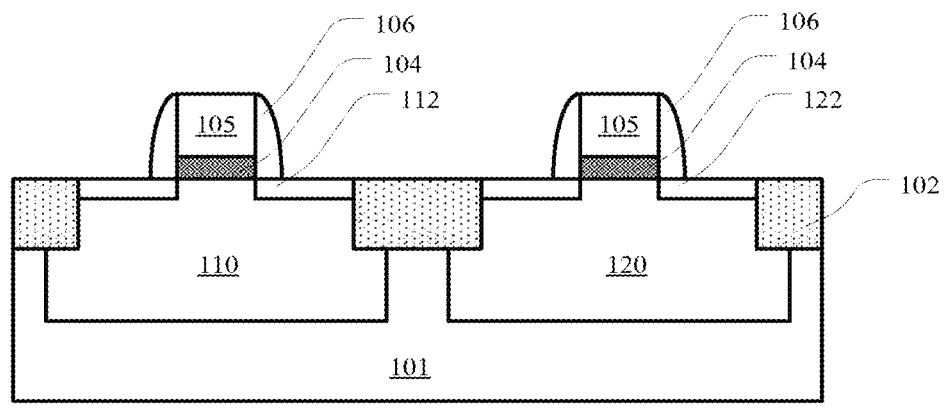

Next, a nitride layer is then formed on the surface of the semiconductor structure by the above conventional deposition process. In an example, the nitride layer is a silicon nitride layer with a thickness of about 5-30 nanometers. Lateral portions of the nitride layer are removed by anisotropic etching, for example, reactive ion etching. Consequently, only vertical portions of the nitride layer remain at side walls of the gate conductor 105 to form gate spacers 106, as shown in FIG. 9.

Figure 10:
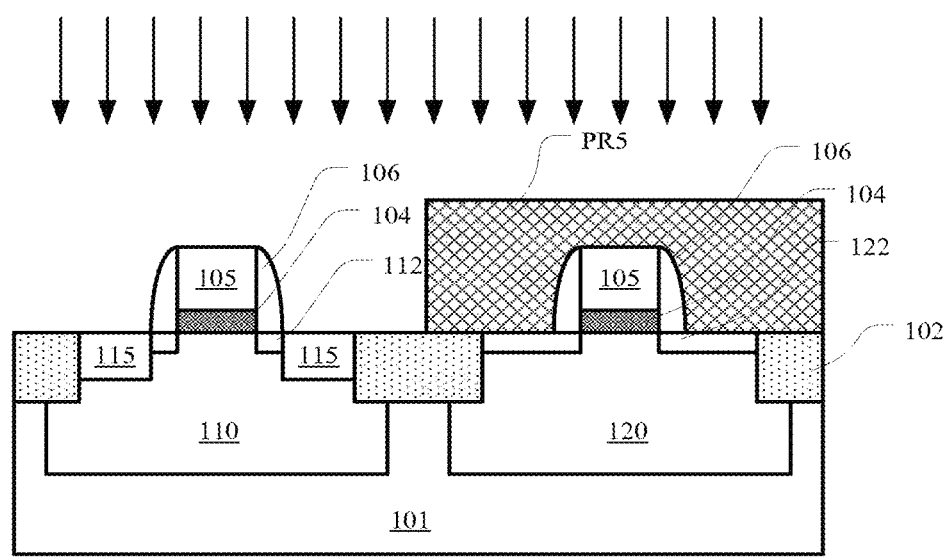

Next, a photoresist layer is formed on a surface of the semiconductor structure, and then patterned by lithography to be a mask PR5. The photoresist mask PR5 blocks the active region of the N-type MOSFET and exposes the active region of the P-type MOSFET. A fifth ion implantation is performed by using the photoresist mask PR5 and with the gate conductor 105, the gate spacers 106 and the shallow trench isolation 102 together as a hard mask. A dopant reaches the N-type well region 110 through the openings in the photoresist mask PR5 in the ion implantation to form P-type source/drain regions 115, as shown in FIG. 10. Moreover, the P-type dopant is also implanted into only the gate conductor 105 of the P-type MOSFET. A portion of the P-type LDD region 112 below the gate spacers 106 remains. Then, the photoresist mask is removed by ashing or dissolution with a solvent.

Figure 11:
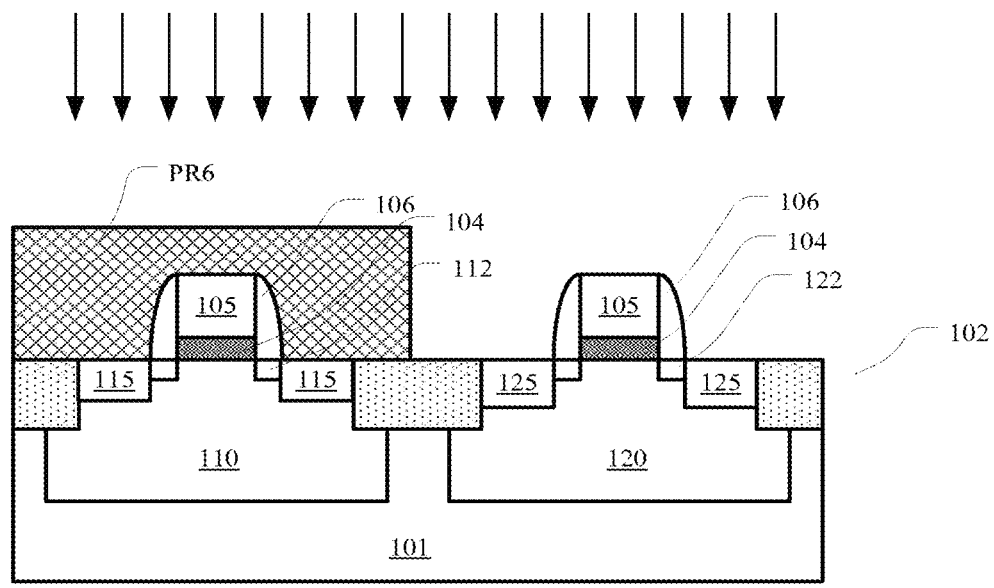

Next, a photoresist layer is formed on a surface of the semiconductor structure, and then patterned by lithography to be photoresist mask PR6. The photoresist mask PR6 blocks the active region of the P-type MOSFET and exposes the active region of the N-type MOSFET. A sixth ion implantation is performed by using the photoresist mask PR6 and with the gate conductor 105, the gate spacers 106 and the shallow trench isolation 102 together as a hard mask. A dopant reaches the P-type well region 120 through the openings in the photoresist mask PR6 in the ion implantation to form N-type source/drain regions 125, as shown in FIG. 11. Moreover, the N-type dopant is also implanted into only the gate conductor 105 of the N-typo MOSFET. A portion of the N-type LDD region 122 below the gate spacers 106 remains. Then, the photoresist mask is removed by ashing or dissolution with a solvent.

Preferably, spike anneal and/or laser anneal may be performed at the temperature of about 1000-1100° C. to activate the dopants after the step of forming the source/drain regions 125 for the N-type MOSFET and the step of forming the source/drain regions 115 for the P-type MOSFET.

Preferably, a metal layer is formed on the surface of the semiconductor structure by the above conventional deposition process, after the step of forming the source/drain regions 125 for the N-type MOSFET and the step of forming the source/drain regions 115 for the P-type MOSFET. The metal layer is made of one from a group consisting of Ni, W, Ti, Co and alloys of any of Ni, W, Ti, Co with others. In an example, the metal layer is a Co layer formed by sputtering. In an example, thermal anneal is then performed for about 1-10 seconds at the temperature of about 300-500° C.

Figure 12:
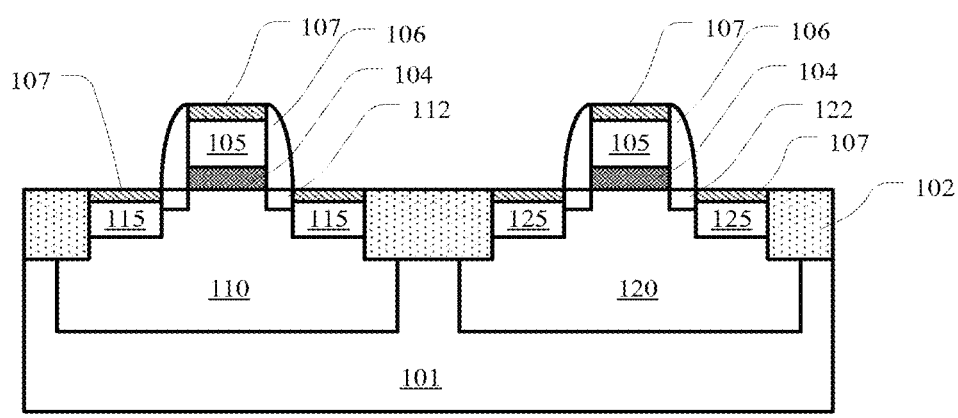

The thermal anneal causes silicidation of the metal layer at surfaces of the source/drain regions 125 of the N-type MOSFET and the source/drain regions 115 of the P-type MOSFET to form a metal silicide layer 107. Meanwhile, the silicidation also occurs at a surface of the gate conductor 105 to form the metal silicide layer 107. The metal silicide layer 107 will reduce contact resistance of the source and drain regions. Remaining portions of the metal layer 111 are removed by well-known dry etching or wet etching, as shown in FIG. 12.

After the steps described in connection with FIGS. 1 to 12, other portions of the CMOS structure are then formed from the resultant semiconductor structure, by subsequent steps of forming an interlayer dielectric layer, forming conductive plugs in the interlayer dielectric layer, forming wirings and electrodes on the surface of the interlayer dielectric layer, and the like.

In the above embodiment, the active regions of the CMOS structure are defined by shallow trench isolation. Alternatively, other isolation structure may be used instead of the shallow trench isolation, for example, a field oxide (FOX) or the like.

In the above embodiment, the N-type well region 110 and the P-type well region 120 are formed in the semiconductor substrate 101 respectively. However, only P-type well region 120 can be formed, without the need for the N-type well region 110, if the semiconductor substrate is N-type itself. Similarly, only N-type well region 110 can be formed, without the need for the P-type well region 120, if the semiconductor substrate 101 is P-type itself.

In the above embodiment, the gate spacers 106 are formed after forming the P-type LDD regions 112 and the N-type LDD regions 122. Alternatively, the gate spacers 106 may be formed before forming the P-type LDD regions 112 and the N-type LDD regions 122. Angled implantation is then performed when forming the P-type LDD regions 112 and the N-type LDD regions 122. The N-type dopant penetrates the gate spacers 106 and reaches the P-type well region 120 to form the N-type LDD regions 122, and the P-type dopant penetrates the gate spacers 106 and reaches the N-type well region 110 to form the P-type LDD regions 112.

Also alternatively, the gate spacers may be formed after forming the N-type LDD regions 122 and before forming the P-type LDD regions 112. Angled implantation is then performed when forming the P-type LDD regions 112. The P-type dopant penetrates the gate spacers 106 and reaches the N-type well region to form the P-type LDD regions 112.

Instead, as shown in FIG. 10, the source/drain regions 115 of P-type MOSFET are formed immediately after forming the P-type LDD regions 112. A fourth ion implantation is performed by using the photoresist mask PR5 and with the gate conductor 105, the gate spacers 106 and the shallow trench isolation 102 together as a hard mask. The dopant reaches the N-type well region 110 through the openings of the photoresist mask PR5. A P-type dopant is used in the fourth ion implantation, which has a dosage larger than that of the N-type dopant used in the third ion implantation. Thus, P-type source/drain regions 115 are formed. The photoresist mask PR5 blocks the active region of the N-type MOSFET and exposes the active region of the P-type MOSFET. Then, the photoresist mask is removed by ashing or dissolution with a solvent.

The step shown in FIG. 11 then continues to form source/drain regions 125 of N-type MOSFET. A photoresist mask PR6 is used in this step, which blocks the active region of the P-type MOSFET and exposes the active region of the N-type MOSFET. A fifth ion implantation is performed by using the photoresist mask PR6 and with the gate conductor 105, the gate spacers 106 and the shallow trench isolation 102 together as a hard mask. A dopant reaches the P-type well region 120 through the openings in the photoresist mask PR6 in the ion implantation to form N-type source/drain regions 125. Then, the photoresist mask is removed by ashing or dissolution with a solvent.

In this embodiment, one photoresist mask is used for forming both the P-type LDD regions and the P-type source/drain regions. The photoresist mask PR4 shown in FIG. 8 can be omitted, which further reduces the number of the photoresist mask and the number of the process steps.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A method for manufacturing a CMOS structure, the method comprising:
   forming a shallow trench isolation structure in a semiconductor substrate for defining first and second regions of said semiconductor substrate;
   forming a first gate stack on said first region of said semiconductor substrate;
   forming a second gate stack on said second region of said semiconductor substrate;
   implanting a dopant of a first type from a top surface of said first and second regions of said semiconductor substrate, to form lightly-doped drain region of said first type;
   after said implanting said dopant of said first type, forming gate spacers on side walls of said first gate stack and said second gate stack;
   implanting a dopant of a second type by angled ionimplantation through said gate spacers by using a first mask as a hard mask, to form lightly-doped drain region of said second type, wherein said first mask blocks said first region and exposes said second region; and
   implanting a dopant of said second type by using said first mask as said hard mask, to form a source/drain region of said second type in said second region,
   wherein when said lightly-doped drain region of said second type is formed, said dopant of said second type over dopes a predetermined region of said lightly-doped drain region of said first type.

2. The method according to claim 1, wherein each of said first gate stack and said second gate stack comprises a gate conductor and a gate dielectric, and said gate dielectric is disposed between said gate conductor and said semiconductor substrate.

3. The method according to claim 2, wherein said gate conductor is made of polysilicon.

4. The method according to claim 3, after said steps of forming said first gate stack and forming said second gate stack, further comprising doping said gate conductor of at least one of said first gate stack and said second gate stack to adjust work function.

5. The method according to claim 2, wherein said gate conductor of said first gate stack contains a dopant of said first type, and said gate conductor of said second gate stack contains a dopant of said first type and a dopant of said second type.

6. The method according to claim 2, wherein said step of forming said first gate stack and said second gate stack comprises:
   forming said gate dielectric on said semiconductor substrate;
   forming said gate conductor on said gate dielectric; and
   patterning said gate dielectric and said gate conductor to expose a portion of said semiconductor substrate by using a third mask as a hard mask.

7. The method according to claim 1, before said step of forming said first gate stack, further comprising at least one of:
   forming a first well region of said second type by implanting a dopant of said second type in said first region of said semiconductor substrate; and
   forming a second well region of said first type by implanting a dopant of said first type in said second region of said semiconductor substrate.

8. The method according to claim 7, wherein at least one of said first well region and said second well region has a doping concentration which is controlled in view of a threshold voltage.

9. The method according to claim 1, further comprising:
   implanting a dopant of said first type by using a second mask as a hard mask, to form source/drain regions of said first type, wherein said second mask blocks said second region and exposes said first region.

10. The method according to claim 9, after said steps of forming said source/drain regions of said first type and forming said source/drain regions of said second type, further comprising:
    performing silicidation to form a metal silicide layer on said source/drain regions of said first type, on said source/drain regions of said second type, and on said gate stack.

* * * * *